(12) United States Patent
Waller

(10) Patent No.: US 6,430,094 B1
(45) Date of Patent: Aug. 6, 2002

(54) METHOD FOR TESTING A MEMORY DEVICE HAVING TWO OR MORE MEMORY ARRAYS

(75) Inventor: William K. Waller, Rockwell, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/571,206

(22) Filed: May 16, 2000

Related U.S. Application Data

(63) Continuation of application No. 09/289,875, filed on Apr. 12, 1999, now Pat. No. 6,081,467, which is a continuation of application No. 08/878,752, filed on Jun. 19, 1997, now Pat. No. 5,930,184.

(51) Int. Cl.[7] .................................................. G11C 7/00
(52) U.S. Cl. .................................. 365/201; 365/189.02
(58) Field of Search ................................. 365/201, 702, 365/189.02, 230.02

(56) References Cited

U.S. PATENT DOCUMENTS

| | | | |
|---|---|---|---|
| 5,726,994 A | 3/1998 | Matsuura et al. | 371/21.1 |
| 5,740,098 A | 4/1998 | Adams et al. | 365/201 |
| 5,848,017 A | 12/1998 | Bissey | 365/201 |

*Primary Examiner*—Vu A. Le
(74) *Attorney, Agent, or Firm*—Kirkpatrick & Lockhart LLP

(57) ABSTRACT

A memory device having two or more memory arrays and a testpath operatively connected to one of the memory arrays and not operatively connected to another of the memory arrays at substantially the same time. The memory device may include multiplexers and sense amplifiers to connect the datapath to the memory arrays. The memory device may also include a datapath connected to two or more memory arrays at the same time through multiplexers and sense amplifiers. The memory array may also be embodied as a memory system, including a processor, control logic, and the memory device. A method of operating a testpath of the memory device includes generating control signals to operatively connect the testpath to one of the memory arrays, and not to connect the testpath to another of the memory arrays at substantially the same time.

33 Claims, 9 Drawing Sheets

METHOD FOR TESTING A MEMORY DEVICE HAVING TWO OR MORE MEMORY ARRAYS

CROSS REFERENCE TO RELATED APPLICATIONS

This is a continuation of copending U.S. patent application Ser. No. 09/289,875, filed Apr. 12, 1999 now U.S. Pat. No. 6,081,467, which is a continuation of U.S. patent application Ser. No. 08/878,752, filed Jun. 19, 1997, now U.S. Pat. No. 5,930,184.

STATEMENT REGARDING FEDERALLY SPONSORED RESEARCH OR DEVELOPMENT

Not Applicable.

BACKGROUND OF THE INVENTION

1. Field of the Invention

The present invention is directed generally to a memory device and, more particularly, to a memory device having two or more memory arrays and a testpath operably connected to one of the memory arrays and not operably connected to another of the memory arrays. The present invention is also directed to a method of operating the testpath.

2. Description of the Background

Memory devices, such as random access memories ("RAMs"), often include more than one memory array. For example, a memory device may include two separate memory arrays that are collectively used by the memory device to store data. One advantage of such a device is that it offers a potential for lower power consumption. For example, one of the memory arrays may be placed in an inactive or low power mode when that memory array is not expected to be used for a period of time. As a result, the power consumed by the device is significantly reduced.

Memory arrays also typically include one or more datapaths from the memory arrays, in which data is stored, to output terminals or DQ pads, through which data signals are provided to and retrieved from the memory arrays. A datapath will selectively provide one or more data signals from the memory arrays to the DQ pads. The particular data signal selected by the datapath depends on the memory address selected. The memory address, or data derived therefrom, is used by the datapath to select desired data signals.

Most memory arrays also typically include a number of redundant memory elements that may be logically substituted for malfunctioning memory elements. That substitution is typically accomplished by remapping the memory device so that read and write operations directed towards a malfunctioning memory element are redirected to a redundant memory element. It is determined which memory elements, if any, are malfunctioning and need to be replaced by testing the memory device. Testing typically involves writing a known pattern of data to the memory device, internally retrieving data from the memory arrays and internally, compressing the data, reading the compressed data from the memory device, and comparing the compressed data to a known compressed data pattern. If a malfunctioning memory element is discovered, it may be logically replaced with redundant memory.

Prior art memory devices, however, suffer from shortcomings. For example, if an error indicative of a malfunctioning memory element is detected, prior art memory devices cannot determine which memory array contains the error. As a result, redundant memory is remapped in both memory arrays, even though an error may be present in only one of the memory arrays. As a result, prior art memory devices use redundant memory inefficiently, thereby reducing the number of defective memory elements that can be replaced in a memory device, and thereby reducing yield and increasing costs.

Some prior art designs having two memory arrays can determine which of the memory arrays contains a defective memory element. Those designs, however, require that both memory arrays remain powered up during normal operation, thereby resulting in increased power consumption when compared with memory devices that power down one or more memory array.

Accordingly, the need exists for a memory device that uses redundant memory in a more efficient manner. More particularly, the need exists for a memory device that can determine which one of several memory arrays contains a malfunctioning memory element. Similarly, the need exists for a memory device that does not require redundant memory to be used in both memory arrays when an error exists in only one of those arrays. Furthermore, the need exists for a memory device that also provides for reduced power consumption, for example, by powering down one or more of the memory arrays that are not in use.

BRIEF SUMMARY OF THE INVENTION

The present invention is directed to a memory device having two or more memory arrays and a testpath operably connected to one of the memory arrays and not operably connected to another of the memory arrays. The memory device may include multiplexers and sense amplifiers to connect the datapath to one of the memory arrays. The memory device may also include a datapath connected to two or more memory arrays at the same time through multiplexers and sense amplifiers. The memory array may also be embodied as a memory system, including a processor, control logic, and the memory device.

The present invention also includes a method of operating a testpath of a memory device. That method includes the steps of generating control signals to operatively connect the testpath to one of a first memory array and a second memory array in the memory device, and not to operably connect the testpath to the other of the first and second memory arrays at substantially the same time.

The present invention solves problems experienced with prior art devices because it can determine which one of two or more memory arrays contain a malfunctioning memory element. Furthermore, the present invention does not require redundant memory to be used in more than one memory array when an error exists in only one of those arrays. Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical memory system. Those of ordinary skill in the art will recognize that other elements may be desirable and/or required in order to implement the present invention. However, because such elements are well known in the art, and because they do not facilitate a better understanding of the present invention, a discussion of such elements is not provided herein. Regarding notation, a signal designation followed by an asterisk ("*") indicates that the signal is a logical complement of a signal having the same designation but without the asterisk. For example, signal RA9* is the logical complement of signal RA9.

Figure 1:
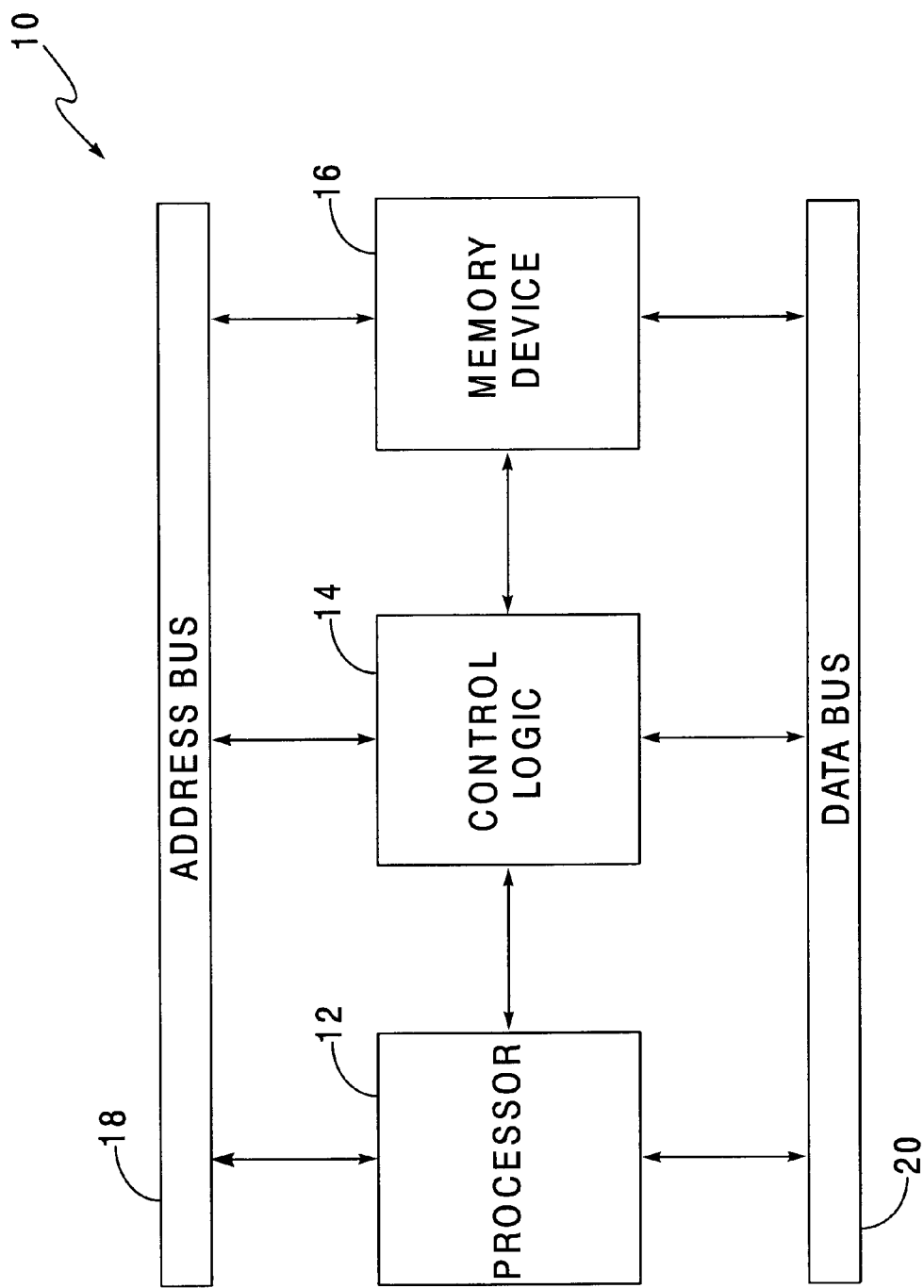
FIG. 1 is a block diagram illustrating a memory system, including a memory device, constructed in accordance with the present invention.

FIG. 1 is a high-level block diagram illustrating a memory system 10 including a processor 12, control logic 14, and a memory device 16. The processor 12 may be any conventional single-chip or multi-chip microprocessor, such as a Pentium® processor, Pentium® Pro processor, an 8051 processor, a MIPS® processor, a Power PC® processor, or an ALPHA® processor. In addition, the processor 12 may be any conventional special purpose microprocessor, such as a digital signal processor or a graphics processor. The processor 12 may be implemented with conventional address lines, conventional data lines, and a number of conventional control lines. The processor 12 initiates data transfer to and from the memory device 16.

The control logic 14 acts as an interface between the processor 12 and the memory device 16. Some signals that the control logic 14 may provide to the memory device 16 include chip enable signals, output enable signals, and address strobe signals. The control logic 14 may provide the memory device 16 with more or less signals, depending on the particular application and design of the memory system 10. For example, if the memory system 10 includes more than one memory device 16, the control logic 14 may provide multiple chip enable signals to selectively enable one or more of the multiple memory devices. Furthermore, if the memory system 10 is a burst memory system, the control logic 14 may also provide a mode signal and an address advance signal to the memory device 16. The control logic 14 may be implemented as an application specific integrated circuit (ASIC).

The memory device 16 stores data, and may be implemented with any conventional, multiple memory array device. For example, the memory device 16 may be a static random access memory (SRAM), a dynamic random access memory (DRAM), a synchronous memory device, and an asynchronous memory device. Although the memory system 10 is illustrated as including only a single memory device 16, the present invention may also be implemented with multiple memory devices.

Address signals may be transferred between the processor 12, the control logic 14, and the memory device 16 by a conventional address bus 18. Similarly, data signals may be transferred between the processor 12, the control logic 14, and the memory device 16 by a conventional data bus 20.

The components forming the memory system 10, including the processor 12, the control logic 14, and the memory device 16, may be fabricated from many different technologies, including silicon-on-insulator technology, silicon-on-sapphire technology, and thin film transistor technology. The preferred embodiment of the present invention is fabricated on a silicon substrate using a conventional doping technology. Furthermore, the present invention is described in terms of an electrical-based technology wherein, for example, connectors and conductors are electrical connectors and electrical conductors. The present invention, however, may also be embodied in other technologies, such as an optical-based technology, wherein the connectors and conductors are optical connectors and optical conductors.

Figure 2:
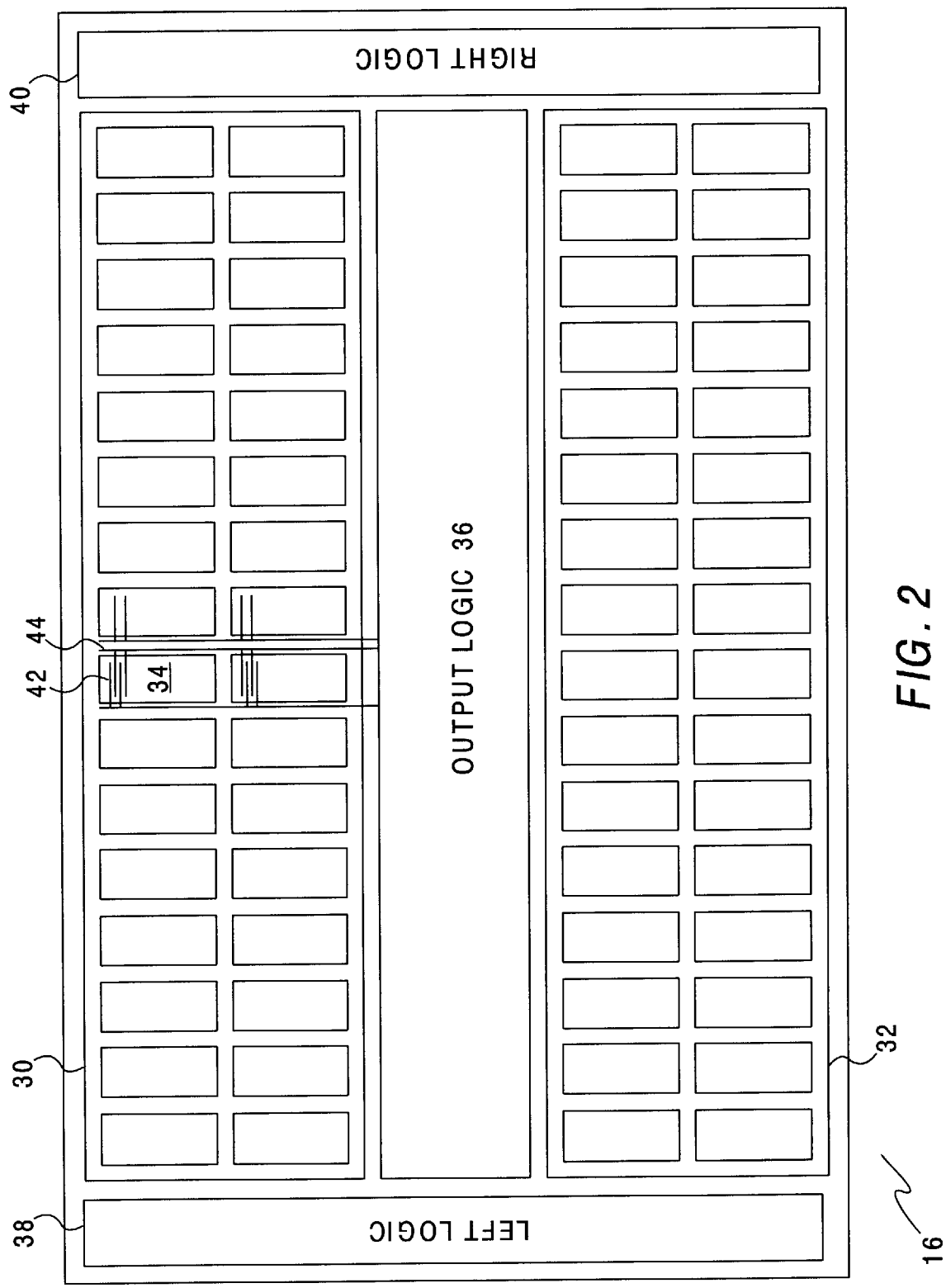
FIG. 2 is a block diagram of the memory device illustrated in FIG. 1, including memory arrays and an output circuit.

FIG. 2 is a block diagram of the memory device 16 illustrated in FIG. 1. Although the present invention will work with a memory device 16 having two or more memory arrays of any size and design, the preferred embodiment of the memory device 16 includes two substantially identical memory arrays, a first memory array 30 and a second memory array 32. The first and second memory arrays 30, 32 may each have a memory capacity of eight megabits, and each of the memory arrays 30, 32 may be formed from thirty-two memory sub-arrays 34. The memory sub-arrays 34 are substantially identical to each other with each memory sub-array 34 having a memory capacity of 256 kilobits (1024 bits). Each of the memory arrays 30, 32 may also include redundant memory that may be used to logically replace one or more portions of defective or malfunctioning memory. That replacement typically is accomplished by remapping an address of a defective or malfunctioning portion of memory to a portion of the redundant memory, as is well known to one of ordinary skill in the art.

The memory device 16 also includes an output circuit 36, a left logic 38, and a right logic 40. The memory device 16 also has a number of input and output terminals for receiving and providing data signals. Those terminals may be in the form of die pads formed on the memory device 16. The output circuit 36 is described hereinbelow with respect to FIGS. 3–8. The left logic 38 includes terminals for receiving power, and power regulation circuits for regulating that power and distributing it to other parts of the memory device 16. For example, the left logic may provide power to the first memory array 30. The left logic 38 also includes address terminals for receiving address signals from the address bus 18 (shown in FIG. 1).

The right logic 40 includes terminals for receiving power and power regulation circuits for regulating power and distributing it to other parts of the memory device 16. For example, the right logic may provide power to the second memory array 32. The right logic 40 also includes input/output terminals, such as DQ pads DQ1–DQ8 (not shown), through which data is transmitted to and received from the data bus 20 (shown in FIG. 1), as well as terminals for receiving an output enable signal, a write enable signal, a column address strobe signal, and a row address strobe signal.

The memory sub-arrays 34 include a number of digitlines 42 that may be connected via transistors to individual memory elements that store signals indicative of data. The precise number of digitlines 42 in each memory sub-array 34 will vary depending on the architecture and memory capacity of the sub-array 34. For clarity, FIG. 2 illustrates only several of the many digitlines 42 that would be present in a typical memory device 16. The digitlines 42 leave the memory sub-arrays 34 and may be connected via transistors to datalines 44. The datalines 44 may be provided between adjacent memory sub-arrays 34 and carry data to the output circuit 36. Each dataline 44 may be connected- to digitlines 42 in two memory sub-arrays 34. FIG. 2 illustrates only several datalines 44, although many more would be present in a typical memory device 16. In the preferred embodiment, each digitline 42 and each dataline 44 is embodied as a differential pair. For clarity, however, those differential pairs are illustrated in the Figures as single lines.

Figure 3:
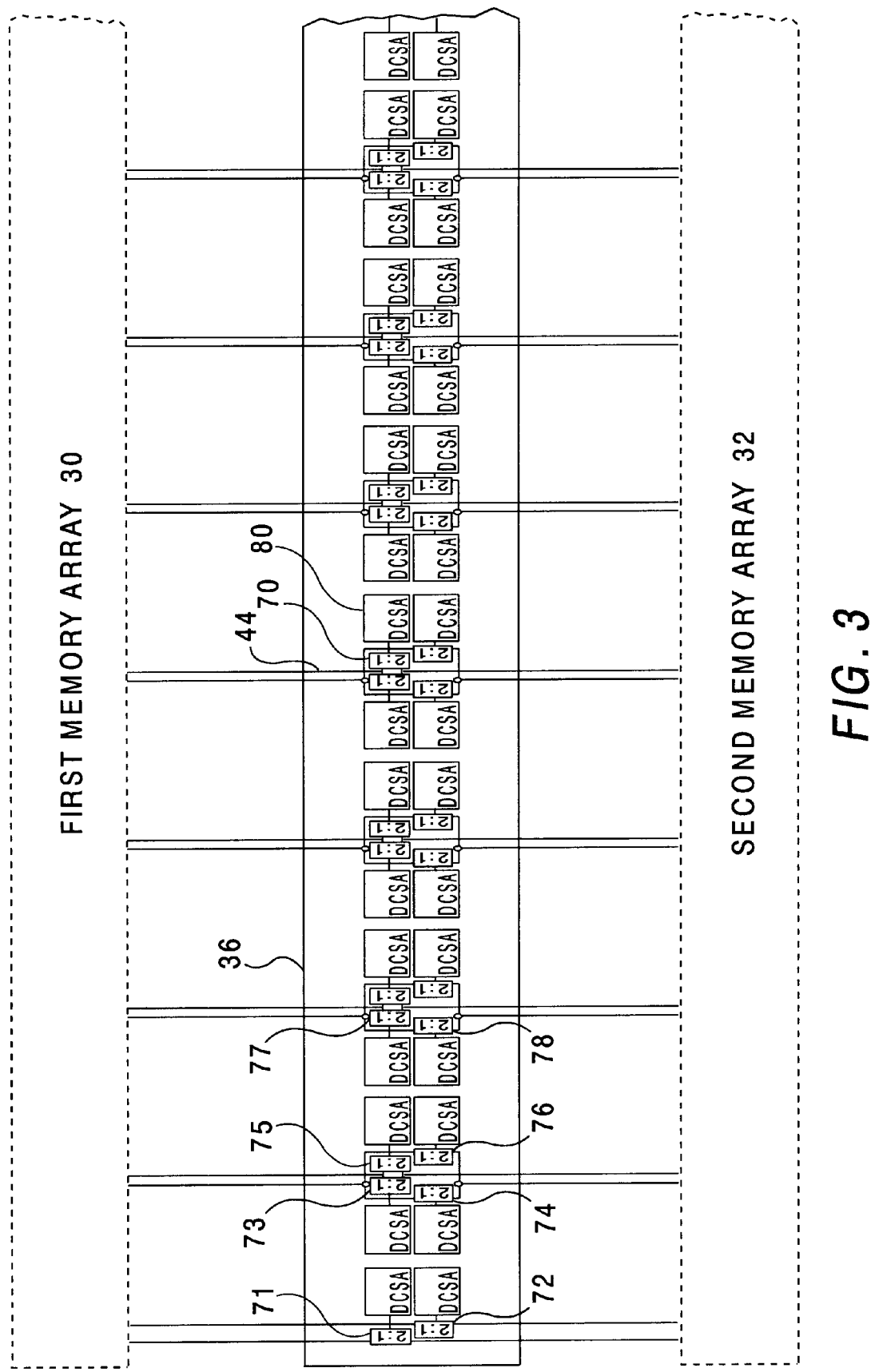
FIGS. 3 and 4 are block-diagrams illustrating connections between the memory arrays and the output circuit illustrated in FIG. 2.
Figure 4:
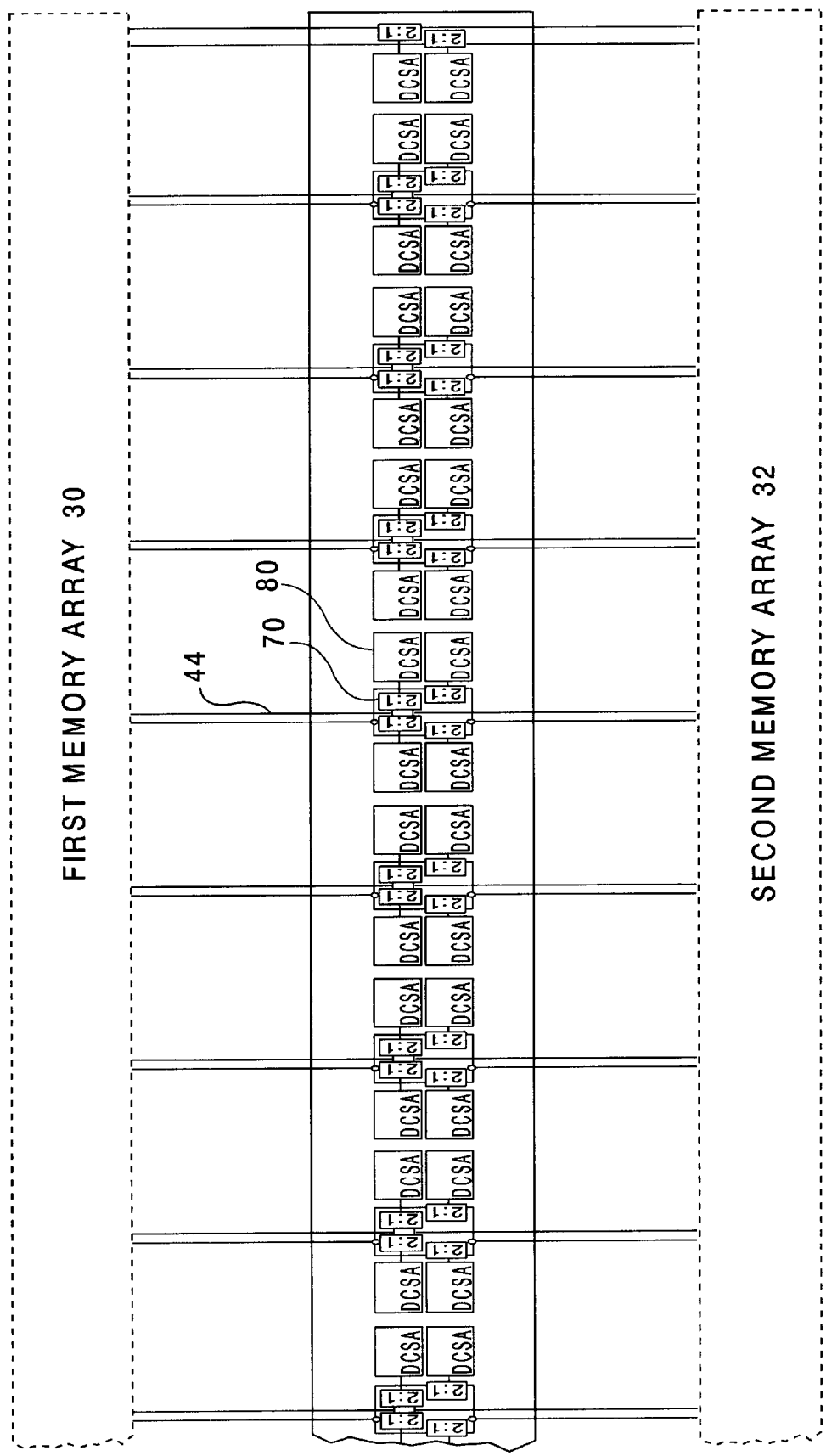

FIGS. 3 and 4 are block-diagrams illustrating connections between the memory arrays 30, 32 and the output circuit 36, illustrated in FIG. 2. The output circuit 36 includes multiplexers 70 (labeled "2:1" in the Figures) for selectively connecting the datalines 44 to direct current sense amplifiers 80 (labeled "DCSA" in the Figures).

Each of the multiplexers 70 has a first input terminal connected to a dataline 44 from the first memory array 30, a second input terminal connected to a dataline from the second memory array 32, and an output terminal. Because in the preferred embodiment the digitlines 44 are differential pairs, the input and output terminals of the multiplexers 70 are formed from pairs of conductors. As a result, the first terminal of each multiplexer 70 receives a differential signal on a dataline 44 from the first memory array 30, the second input terminal of each multiplexer 70 receives a second differential signal on a dataline 44 from the second memory array 32, and the output terminal produces one of the first and second differential signals. For clarity, however, the differential pairs are illustrated in the Figures as single lines.

Because each of the multiplexers 70 receives signals from both of the memory arrays 30, 32, control of the multiplexers 70 will determine whether data signals are provided from the first memory array 30 or the second memory array 32. In the preferred embodiment, the multiplexers 70 are controlled by a row address signal RA9 and its logical compliment RA9*. A subset of the multiplexers 70 are labeled as 71–78 for the purpose of illustrating the manner in which the row address signals RA9 and RA9* control the multiplexers. Multiplexers 71–74 are controlled by signal RA9 and multiplexers 75–78 are controlled by signal RA9*. Because RA9 and RA9* are logical complements of each other, if multiplexers 71–74 provide data signals from the first memory array 30, multiplexers 75–78 will provide data signals from the second memory array 32. That pattern repeats throughout the memory device 16. As a result, the multiplexers 70 may be viewed as groups of multiplexers that alternately provide data from the first and second memory arrays 30, 32.

One sense amplifier 80 is connected to the output terminal of each multiplexer 70. One function of the sense amplifiers 80 is to sense and amplify weak differential signals received via the multiplexer 70. The signals produced by the sense amplifiers 80 are indicative of data stored in the memory arrays 30, 32, and may be provided to DQ pads in the right logic 40 (shown in FIG. 2) through either a read datapath, as described hereinbelow with respect to FIGS. 5 and 6, or a read testpath, as described hereinbelow with respect to FIGS. 7 and 8.

Figure 5:
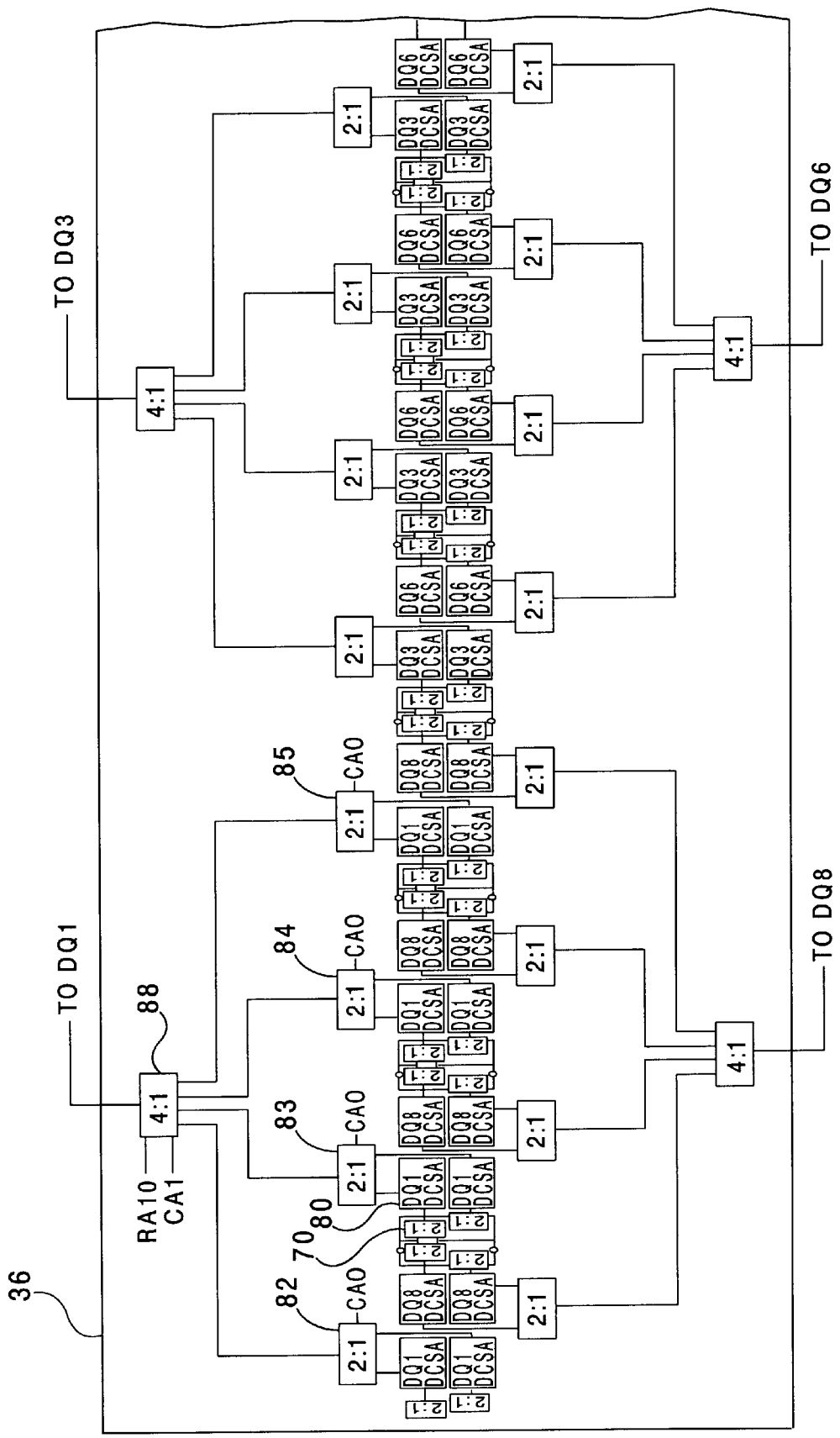
FIGS. 5 and 6 are block diagrams illustrating a read datapath in the output circuit illustrated FIG. 2.
Figure 6:
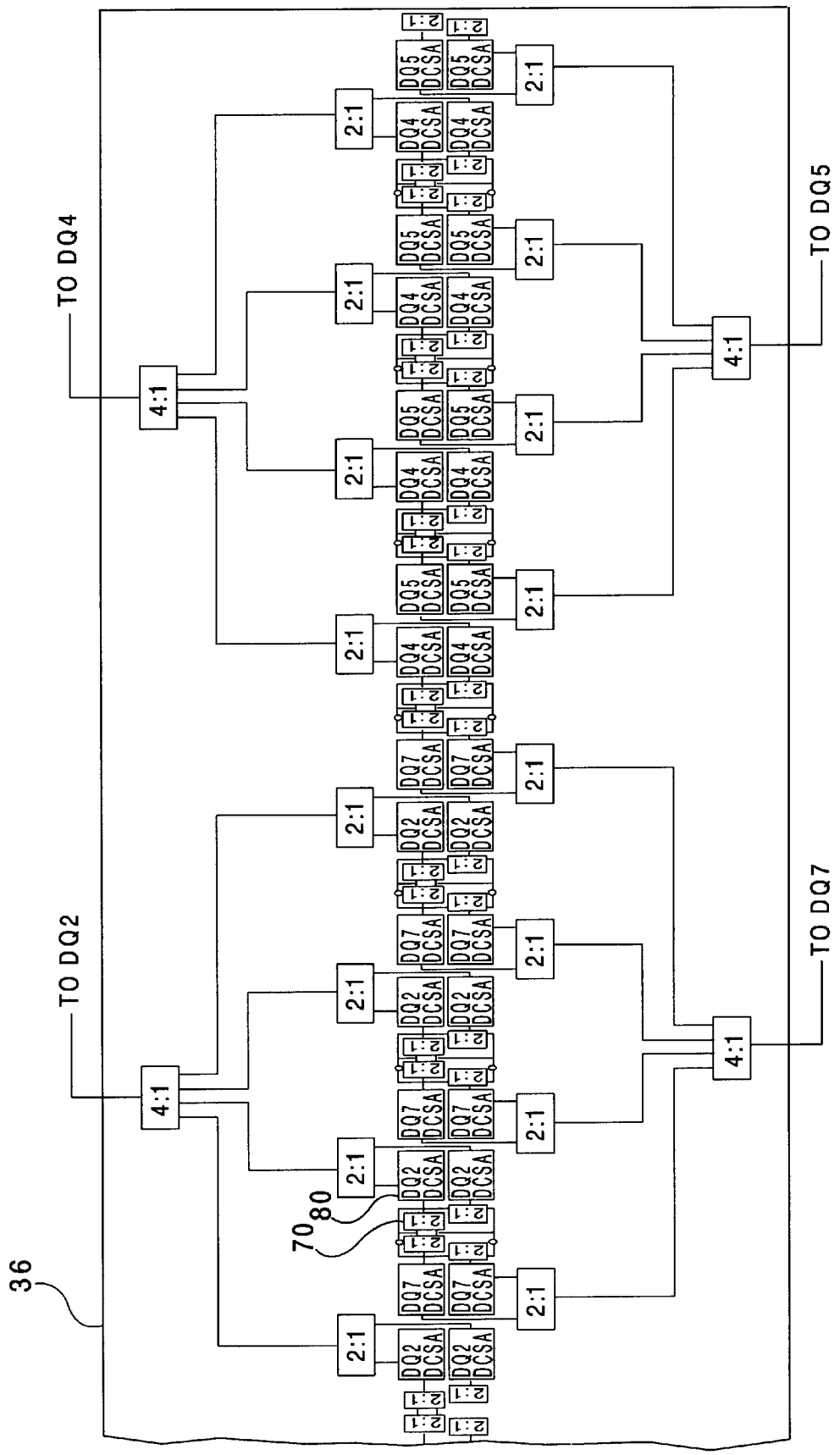

FIGS. 5 and 6 are block diagrams illustrating a portion of read datapaths in the output circuit 36. The datapaths are used to provide a signal indicative of data stored in a selected memory location from one of the memory arrays 30, 32 to the DQ pads in the right logic 40. Although the datapaths may be considered as beginning at the memory sub-arrays 34 and extending to the DQ pads in the right logic 40, the present invention focuses on the datapath only between the sense amplifiers 80 and the DQ pads. In the preferred embodiment, there are eight datapaths that each lead to one of eight DQ pads DQ1–DQ8. The datapaths will be described in detail with respect to one datapath illustrated in the upper left portion of FIG. 5 and connected to DQ1. Because the datapaths are substantially identical to each other, the description of the datapath leading to DQ1 is illustrative of the other datapaths leading to the other DQ pads, DQ2–DQ8.

The datapath includes four two-to-one multiplexers 82, 83, 84, 85. Each of the multiplexers 82–85 has first and second input terminals and an output terminal. Each of the first and second input terminals is connected to an output terminal of one of the sense amplifiers 80 and receives a signal indicative of data stored in one of the memory arrays 30, 32. Because some of the multiplexers 70 providing data signals to the sense amplifiers 80 are controlled by row address signal RA9, and others are controlled by row address signal RA9*, multiplexers 82, 84 provide data signals from one of the memory arrays 30, 32 and multiplexers 83, 85 provide data signals from the other of the memory arrays 30, 32. The multiplexers 82–85 may be controlled by a column address signal CA0 to selectively provide to the output terminal one of the signals on the input terminals. The multiplexers 82–85 collectively receive eight data signals indicative of eight bits of data stored in the memory arrays 30, 32, and collectively produce four of those eight signals at their output terminals.

A four-to-one multiplexer 88 has four input terminals and an output terminal, and may be controlled by a row address signal RA10 and a column address signal CA1. In the preferred embodiment, the row address signal RA10 used with the multiplexer 88 is a signal that selects which of the arrays 30, 32 is being addressed. The input terminals of the multiplexer 88 are each connected to one of the output terminals of multiplexers 82–85. The output terminal of multiplexer 88 is connected to DQ1. In the preferred embodiment, the output terminal is connected to DQ1 via an output buffer (not shown) in the right logic 40. The four-to-one multiplexer 88 selectively connects one of the signals on its input terminals to DQ1.

In summary, row address signals and column address signals selectively provide data signals from the memory arrays 30, 32, to the output circuit 36. Those signals are indicative of data stored in selected portions of the memory arrays 30, 32. The multiplexers 70 each selectively provide a signal to the sense amplifiers 80. Because of the alternating control of the multiplexers 70 by signals RA9 and RA9*, four signals from the first memory array 30 and four signals from the second memory array 32 are provided to the sense amplifiers 80. The sense amplifiers 80 sense and amplify the signals and each provides a signal to one of the multiplexers 82–85. The multiplexers 82–85 each selectively provide one signal to the four-to-one multiplexer 88, which selectively provides one of the signals to DQ1, which makes the signal accessible outside of the memory device 16, such as to the data bus 20. The data provided at DQ1 may come from either the first memory array 30 or the second memory array 32.

Figure 7:
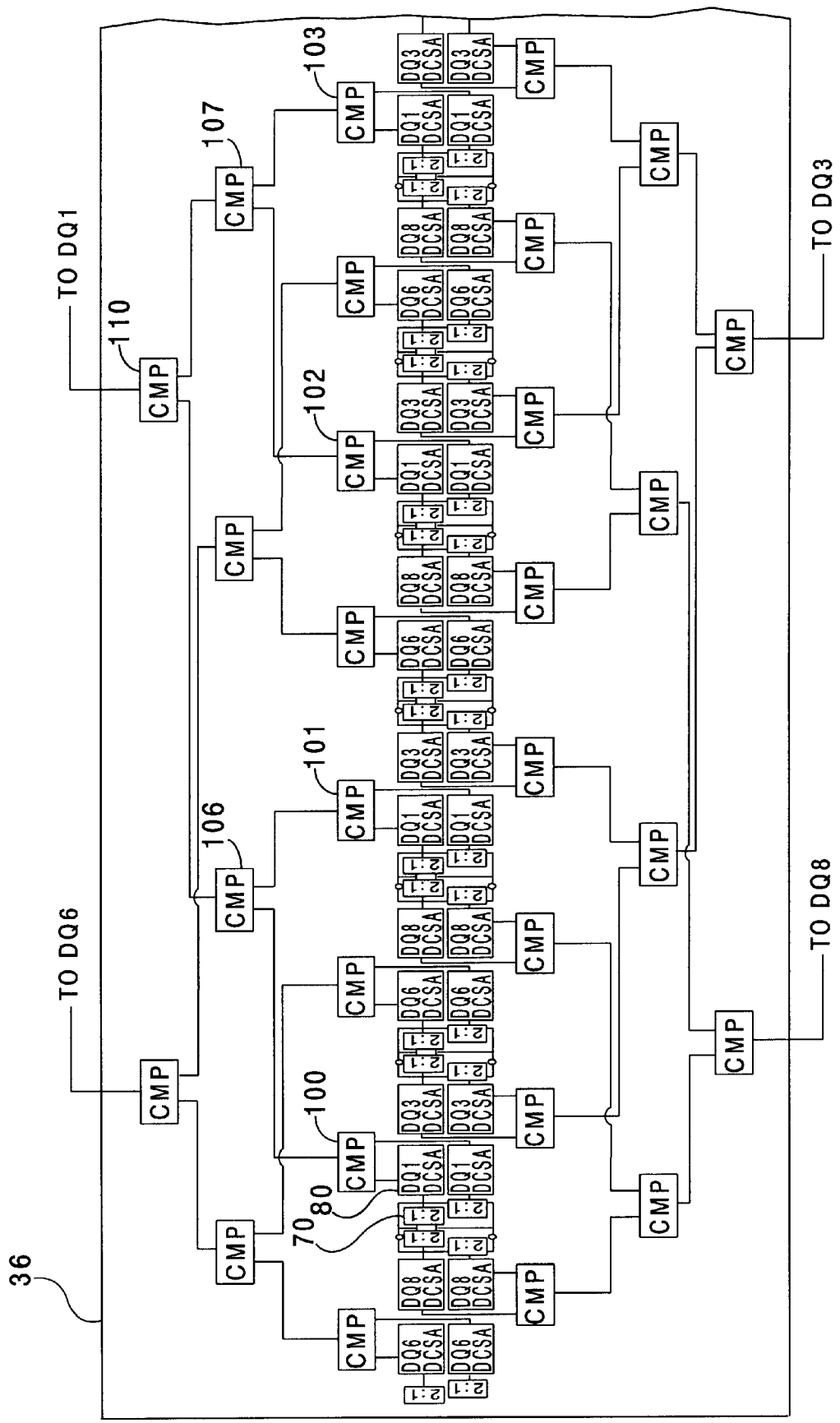
FIGS. 7 and 8 are block diagrams illustrating a read testpath in the output circuit illustrated in FIG. 2.
Figure 8:
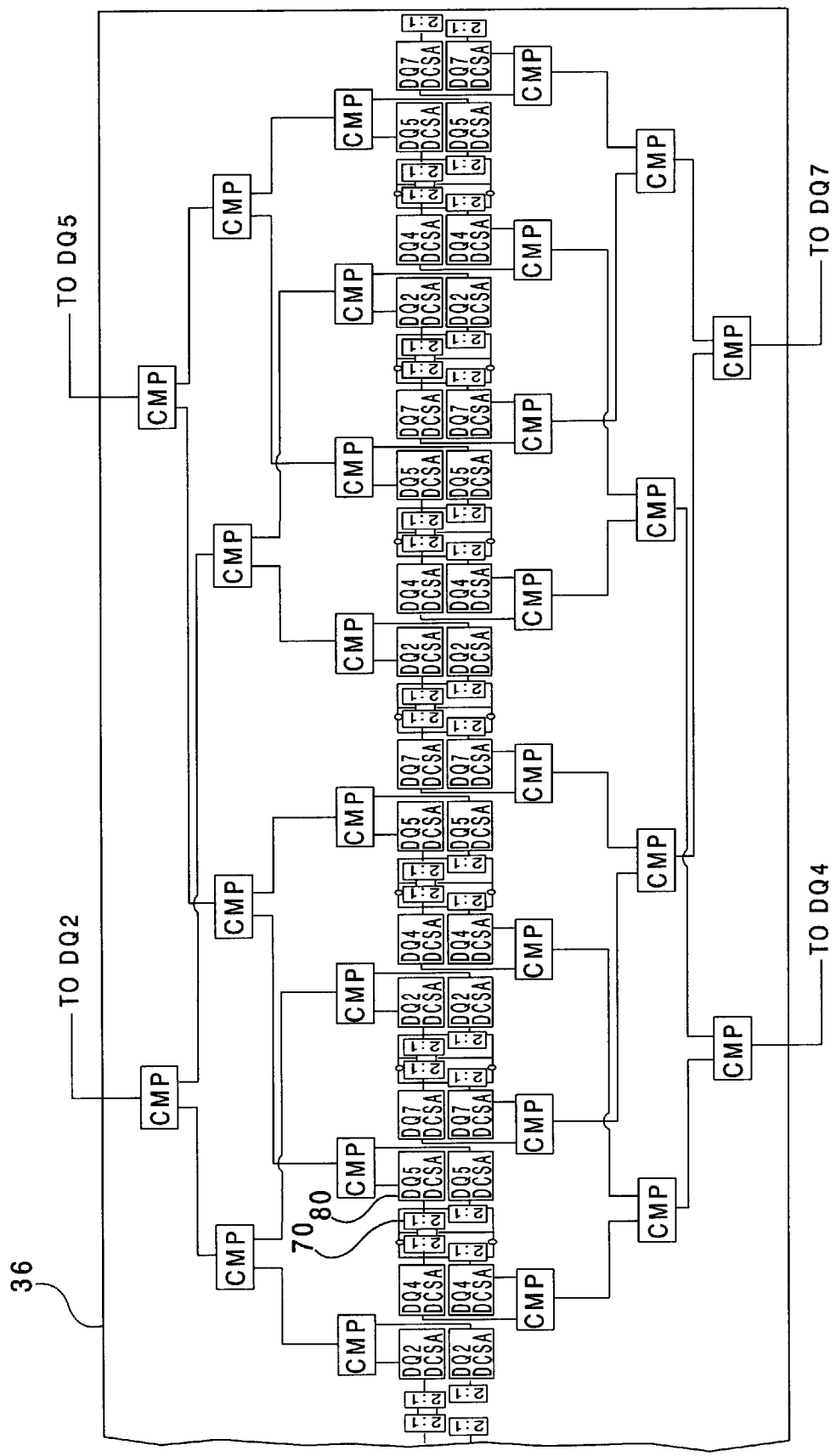

FIGS. 7 and 8 are block diagrams illustrating a portion of the testpaths in the output circuit 36 illustrated in FIG. 2. The testpaths may be used to provide signals indicative of data stored in the memory arrays 30, 32 to the DQ pads for the purpose of testing. Although the testpaths may be considered as beginning at the memory sub-arrays 34 and extending to the DQ pads in the right logic 40, the present invention focuses on the testpath only between the sense amplifiers 80 and the DQ pads. In the preferred embodiment, there are eight testpaths that each lead to one of eight DQ pads, DQ1–DQ8, in the right logic 40.

Both of the memory arrays 30, 32 are powered up at the same time for testing. As a result, although in the preferred embodiment normal operation may have a 2K or a 4K refresh, the test mode for the same memory device may have a 1K refresh. During testing, data may be stored in the memory arrays 30, 32 in a known pattern, and thereafter that data is retrieved from the memory arrays 30, 32 and compared to the known pattern to determined whether the memory arrays 30, 32 are functioning properly. The test data may be compressed to allow for quicker testing of the memory device 16. For example, the test data may be logically combined inside the memory device 16 in a known manner to reduce the number of bits that must be read from the memory device 16. For example, if data in a sixteen megabit device is compressed at a ratio of: eight-to-one, only two megabits of compressed data need to be read from the device, as opposed to sixteen megabits of uncompressed data. Although compression limits the ability to determine precisely what bit is malfunctioning, that information is typically not necessary because individual memory bits are typically not replaced. Rather, memory is replaced in blocks having a predetermined size, regardless of how many defective bits are found in that block. As a result, it is desirable to obtain maximum data compression and retain the ability to identify which predetermined block contains one or more malfunctioning bits. If a portion of one of the memory arrays 30, 32 is found to be defective or malfunctioning, that portion is replaced by redundant memory, such as through remapping the defective memory address to the redundant memory. In the preferred embodiment, there are eight discrete testpaths, one for each DQ pad DQ1–DQ8 located in the right logic 40. The testpaths may utilize comparators (labeled as "CMP" in the Figures), which logically combine signals received at input terminals and provide at an output terminal a signal indicative of the logical comparison of those signals. In the preferred embodiment the testpaths use comparators to perform logical AND operations. Other operations, of course, are also possible. For example, logical OR operations, logical exclusive-OR operations, and any one of several other logical operations. Unlike the datapaths, the testpaths do not provide a signal indicative of a single bit of data, but rather provide a signal indicative of a logical comparison of a number of selected memory elements.

The testpaths will be described in detail with respect to one testpath illustrated in the upper portion of FIG. 7 and connected to DQ1. Because the testpaths are substantially identical to each other, the description of the testpath leading to DQ1 is illustrative of the other testpaths leading to the other DQ pads DQ2–DQ8. The testpath includes four comparators 100, 101, 102, 103, each having first and second input terminals and an output terminal. Each of the first and second input terminals is connected to an output terminal of one of the sense amplifiers 80. All of the comparators 100–103 receive signals indicative of data stored in only one of the memory arrays 30, 32 because the comparators 100–103 are connected to alternate groups of multiplexers 70 and sense amplifiers 80. As a result, all of the multiplexers 70 providing signals to the comparators 100–103 are controlled by the same signal, either RA9 or RA9*. Therefore, those multiplexers 70 are all providing signals from the same memory array 30, 32. The comparators 100–103 collectively receive eight signals indicative of eight bits of data stored in only one of the memory arrays 30, 32, and collectively produce four signals indicative of logical combinations of those signals.

The testpath also includes two, two-to-one comparators 106, 107, which perform logical operations on signals provided at their input terminals, and provide output signals at their output terminals. Those signals are provided to input terminals of another two-to-one comparator 110, which performs a logical operation on signals provided at its input terminals and provides a signal to DQ1. DQ1 makes the signal accessible outside of the memory device 16, such as to the data bus 20. Although both of the memory arrays 30, 32 are powered up during testing, the signals in the testpath to DQ1 are all provided from only one of the memory arrays 30, 32. As a result, in the event that a malfunctioning memory element is detected, the architecture of the testpath allows the memory device 16 to determine, with certainty, which of the memory arrays 30, 32 contains the malfunctioning memory element, thereby eliminating a prior art practice of replacing memory elements in both of the arrays 30, 32. Furthermore, the present invention also provides for reduced power consumption by allowing one of the arrays 30, 32 to be powered down during normal operation.

For example, assume that all logic high values have been programmed into the memory arrays 30, 32, and that the comparators 100–103 perform logical AND operations. If all of the comparators 100–103 receive only logic high signals at their input terminals, they will provide only logic high signals at their output terminals. Those logic high signals will propagate to the input terminals of comparators 106, 107 which will also provide logic high signals at their output terminals. The comparator 110 will receive logic high signals at its input terminals, and will provide a logic high signal at its output terminal and to DQ1. The logic high signal at DQ1 is indicative that the tested portion of the memory array is operating properly. If, however, one of the comparators 100–103, such as comparator 103, receives a logic low signal, it will produce a logic low signal at its output terminal. That signal will cause a logic low signal to be provided at the output terminal of comparator 107, regardless of the state of the signal provided by comparator 102. Finally, the logic low signal produced at the output terminal of comparator 107 will cause a logic low signal to be produced at the output terminal of comparator 110, resulting in a logic low signal at DQ1. That logic low signal at DQ1 indicates that there is a problem with the portion of the memory array being tested, and may result in that portion of the memory array being re-mapped to a redundant portion of the memory array, thereby preserving the proper operation of the memory device 16. Because all of the comparators 100–103 receive signals indicative of data in only one of the memory arrays 30, 32, it is possible to know, with certainty, which of the memory arrays 30, 32 is malfunctioning, and thereby it is possible to remap only the malfunctioning portion of the memory device 16.

Figure 9:
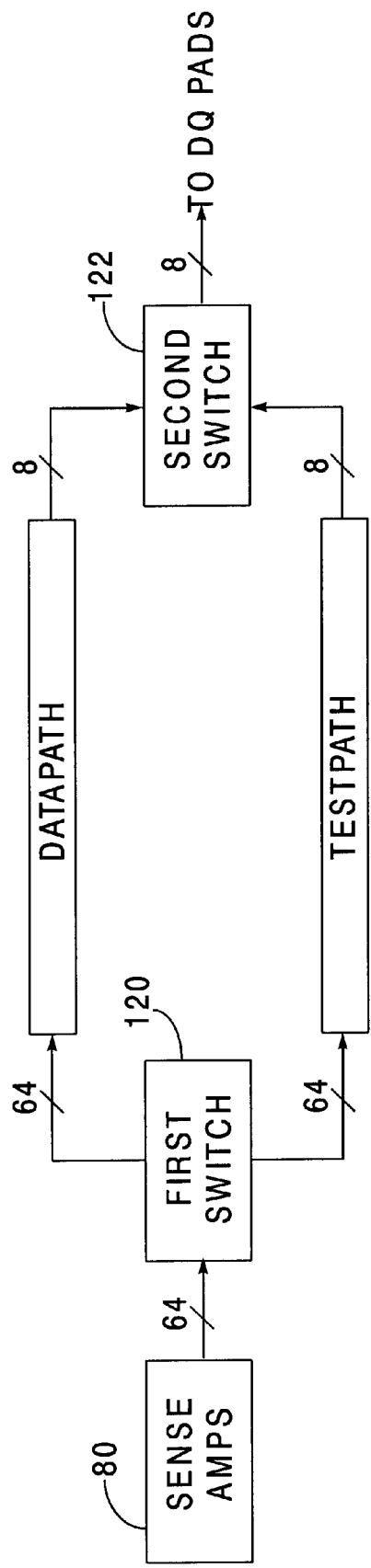
FIG. 9 is a block diagram illustrating a switching system for selecting one of the datapath and the testpath.

Because the datapath and the testpath may use and receive signals from many of the same components, such as digit-lines 42, datalines 44, multiplexers 70, sense amplifiers 80, and DQ pads DQ1–DQ8, there is preferably provided a system for selectively connecting those components to the datapath and the testpath. FIG. 9 is a block diagram illustrating a portion of the memory device 16 for selectively using either the datapath or the testpath. For example, a first switch 120 may be provided between the sense amplifiers 80 and both the datapath and testpath. That switch 120 can control whether data signals produced by the sense amplifiers 80 are provided to the datapath or the testpath. The switch 120 may be controlled by an external control signal or it may default to provide data signals to the datapath unless a special test signal is provided to the memory device 16, in which case the first switch 120 would provide data signals from the sense amplifiers 80 to the testpath. The first switch 120 may be embodied as one device, such as a 64-to-128 multiplexer, or it may be embodied as multiple devices, such as a number of one-to-two multiplexers located at each of the sense amplifiers 80. A second switch 122 may also be provided to selectively connect one of the datapath and the testpath to the DQ pads. The second switch 122 may controlled and embodied in a manner analogous to the first switch 120. If the components forming the datapath and testpath allow the flow of data in only the desired direction, as in the preferred embodiment, the second switch 122 may be eliminated and the datapath and testpath may both be directly connected to the DQ pads DQ1–DQ8.

Those of ordinary skill in the art will recognize that many modifications and variations of the present invention may be implemented, and that the description provided herein is illustrative of the preferred embodiment only. The present invention, however, is applicable to other embodiments. For example, both more and less datapaths and testpaths may be used with the present invention. In addition, more, less, and different types of multiplexers may be used in a datapath and more, less, and different types of comparators may be used in a testpath. For example, a read datapath may have a single eight-to-one multiplexer. Likewise, a testpath may have a single eight-to-one comparator. Other modifications include a single four-to-two multiplexer used in place of pairs of two-to-one multiplexers 70 illustrated in FIG. 3. In another alternative embodiment, the memory device may eliminate or modify its use of differential signals and differential signal lines, such as by forming datalines and multiplexers from other than pairs of conductors and pairs of connectors. For example, forming datalines and multiplexer terminals from single conductors and single connectors. In another embodiment, the sense amplifiers may perform an additional function of converting differential signals to single signals carried on a single conductors. The foregoing description and the following claims are intended to cover all such modifications and variations.

What is claimed is:

1. A method for testing a memory device having first and second memory arrays, comprising:
    selectively reading data from one of the two memory arrays;
    performing a logical operation on the data; and
    comparing an output indicative of the logical operation to a predetermined reference.

2. The method of claim 1, wherein selectively reading includes providing data from each of the first and second memory arrays to a selective connector.

3. The method of claim 2, wherein providing data includes inputting data from each of the first and second memory arrays to a multiplexer.

4. The method of claim 1, wherein comparing the output includes comparing a logic level of an output bit indicative of the logical operation to the predetermined reference.

5. The method of claim 1, wherein performing a logical operation includes performing a logical AND operation.

6. The method of claim 5, wherein performing a logical operation includes performing a plurality of logical operations on the data.

7. A method for testing a memory device having first and second memory arrays, comprising:
    selectively reading N data bits from one of the two memory arrays;
    performing N−1 logical operations on the N data bits; and
    comparing an output indicative of the N−1 logical operations to the predetermined reference.

8. The method of claim 7, wherein performing N−1 logical operations includes performing N−1 logical AND operations on the N data bits.

9. The method of claim 7, wherein comparing includes comparing a logic level of a binary output bit indicative of the N−1 logical operations to the predetermined reference.

10. A method for testing a memory device having first and second memory arrays, comprising:
    selectively reading data from one of the two memory arrays;
    performing a logical operation on the data;
    comparing an output indicative of the logical operation to a predetermined reference; and
    replacing a portion of the first memory array with a redundant memory portion when the logic level of the binary signal does not coincide with the predetermined reference.

11. The method of claim 10, wherein replacing includes remapping an address of the portion of the first memory array to the redundant memory portion.

12. A method for testing a memory device having two memory arrays, comprising:
    selectively reading N data bits from a first of the two memory arrays;
    performing N−1 logical operations on the N data bits;
    comparing an output indicative of the N−1 logical operations to the predetermined reference; and
    replacing a portion of the first memory array with a redundant memory portion when the output indicative of the N−1 logical operations does not coincide with the predetermined reference.

13. A method for testing a memory device having first and second memory arrays, comprising:
    selectively reading data from the first memory array;
    selectively propagating the read data from the first memory array through one of a testpath and a datapath; and
    selectively connecting one of the testpath and the datapath to an output terminal of the memory device.

14. The method of claim 13, wherein selectively propagating includes selectively connecting the first memory array to one of the testpath and the datapath.

15. The method of claim 14, wherein selectively connecting includes selectively connecting the first memory array to the testpath when both memory devices are powered up and the datapath when only the first memory array is powered up.

16. The method of claim 13, wherein selectively propagating includes selectively propagating the read data from the first memory array through one of a plurality of testpaths and a plurality of datapaths.

17. A method of testing a memory device having first and second memory arrays, comprising:
    selectively reading a plurality of data bits from the first memory array;
    selectively connecting the first memory array to one of a testpath and a datapath; and comparing a logic level of a binary output bit at an output terminal of the first memory array indicative of a logical operation performed on the plurality of data bits a predetermined reference when the first memory array is connected to the testpath.

18. The method of claim 17, wherein:

selectively reading includes selectively reading N data bits from the first memory array; and comparing includes comparing a logic level of a binary output bit at the output terminal of the first memory array indicative of N−1 logical operations performed on the N data bits to a predetermined reference when the first memory array is connected to the testpath.

19. The method of claim 17, wherein selectively connecting includes selectively connecting the first memory array to one of a plurality of testpaths and a plurality of datapaths.

20. A method of testing a memory device having first and second memory arrays, comprising:

selectively reading an array of N×M data bits from the first memory array;

selectively connecting the first memory array to one of M testpaths and M datapaths; and comparing a logic level of M binary output bits at M output terminals of the first memory array indicative of a plurality of logical operations performed on the data bits to a predetermined reference pattern when the first memory array is connected to the M testpaths.

21. A method of testing a memory device having first and second memory arrays, comprising:

selectively reading an array of N×M data bits from the first memory array;

selectively connecting the first memory array to one of M testpaths and M datapaths;

comparing a logic level of M binary output bits at M output terminals of the first memory array indicative of a plurality of logical operations performed on the data bits to a predetermined reference pattern when the first memory array is connected to the M testpaths; and replacing a portion of the first memory array when the logic levels of the M binary output bits do not coincide with the predetermined reference pattern.

22. A method of testing a memory device having first and second memory arrays, comprising:

selectively reading an array of N×M data bits from the first memory array;

selectively connecting the first memory array to one of M testpaths and M datapaths;

performing N−1 logical operations on each of M groups of N data bits when the first memory array is connected to the M testpaths; and comparing a logic level of M binary output bits at M output terminals of the first memory array indicative of the N−1 logical operations performed on each of the M groups of N data bits to the predetermined reference pattern when the first memory array is connected to the M testpaths.

23. A method of testing a memory device having first and second memory arrays, comprising:

selectively reading an array of N×M data bits from the first memory array;

selectively connecting the first memory array to one of M testpaths and M datapaths;

performing N−1 logical operations on each of M groups of N data bits when the first memory array is connected to the M testpaths;

comparing a logic level of M binary output bits at M output terminals of the first memory array indicative of the N−1 logical operations performed on each of the M groups of N data bits to the predetermined reference pattern when the first memory array is connected to the M testpaths; and replacing a portion of the first memory array with a redundant memory portion when the logic level of the M binary output bits do not coincide with the predetermined reference pattern.

24. The method of claim 23, wherein replacing includes replacing the portion of the first memory array from which the array of N×M data bits was read.

25. The method of claim 23, wherein replacing includes remapping addresses of the portion of the first memory array to the redundant memory portion.

26. The method of claim 25, wherein remapping includes remapping address of the portion of the first memory from which the array of N×M data bits was read to the redundant memory portion.

27. A method of operating a memory device having two memory arrays, comprising:

performing a plurality of logical operations on a plurality of data bits in only one of the memory arrays;

comparing a logic level of a binary output bit indicative of the plurality logical operations with a predetermined reference; and performing one of reading data from and writing data to one of the memory arrays while another of the memory arrays is powered down.

28. A method of operating a memory array having first and second memory arrays, comprising:

selectively testing a portion of one of the first and second memory arrays while each of the first and second memory arrays are powered up; and performing one of reading data from and writing data to the first memory array while the second memory array is powered down.

29. The method of claim 28, wherein selectively testing includes testing a portion of the first memory array.

30. The method of claim 28, wherein selectively testing includes testing a portion of the second memory array.

31. The method of claim 29, wherein testing a portion of the first memory array includes:

writing a predetermined data pattern to the portion of the first memory array;

compressing the data;

reading the compressed data from the first memory array; and comparing a pattern of the compressed data to a predetermined compressed data pattern.

32. The method of claim 31, further comprising replacing the portion of the first memory array with a redundant memory portion when the pattern of the compressed data does not coincide with the predetermined compressed data pattern.

33. The method of claim 32, wherein replacing the portion of the first memory array includes remapping the portion of the first memory to the redundant memory portion.

* * * * *